US005550475A

United States Patent [19]
Shafer

[11] Patent Number: 5,550,475
[45] Date of Patent: Aug. 27, 1996

[54] PROGRAMMABLE BATTERY CHARGE INDICATOR

[76] Inventor: Timothy M. Shafer, R.R. #2 Box 78, Yankton, S. Dak. 57078

[21] Appl. No.: 420,145

[22] Filed: Apr. 11, 1995

[51] Int. Cl.$^6$ .......................... H02J 7/04; G01N 27/416; G01R 31/36
[52] U.S. Cl. ........................................ 324/433; 324/427
[58] Field of Search .................................. 324/425, 426, 324/427, 429, 430, 433, 434, 436

[56] References Cited

U.S. PATENT DOCUMENTS

| | | | |
|---|---|---|---|
| 4,560,937 | 12/1985 | Finger | 324/433 |
| 5,357,203 | 10/1994 | Landau et al. | 324/433 |
| 5,454,710 | 10/1995 | Landau et al. | 324/427 |

*Primary Examiner*—Michael Tokar

[57] ABSTRACT

A programmable battery charge indicator including a pair of electrically-conductive terminals coupleable to a test battery; a user-actuated and timer-controlled power delivery mechanism coupled with the terminals for allowing transmission of electrical power from a test battery for a given period of time; a reference voltage generating mechanism coupled to the power delivery mechanism for generating a standard battery reference voltage and a user-programmed battery reference voltage; a comparator mechanism coupled to the reference voltage generating mechanism and power delivery mechanism for generating an overcharged designator signal representing an overcharged battery condition and for generating an undercharged designator signal representing an undercharged battery condition; and a display mechanism operatively coupled to the comparator mechanism and power delivery mechanism for indicating the charge condition on a test battery and displaying the optimum level of discharge state at which the test battery should be recharged to maximize battery life.

6 Claims, 4 Drawing Sheets

PROGRAMMABLE BATTERY CHARGE INDICATOR

BACKGROUND OF THE INVENTION

1. Field of the Invention

The present invention relates to a programmable battery charge indicator and more particularly pertains to allowing a user to monitor the condition and charge of a regular and deep cycle 12 volt lead-acid battery with a programmable battery charge indicator.

2. Description of the Prior Art

The use of battery charge indicators is known in the prior art. More specifically, battery charge indicators heretofore devised and utilized for the purpose of monitoring the charge on a battery are known to consist basically of familiar, expected and obvious structural configurations, notwithstanding the myriad of designs encompassed by the crowded prior art which have been developed for the fulfillment of countless objectives and requirements.

By way of example, U.S. Pat. No. 4,460,870 to Finger discloses a quiescent voltage sampling battery state of charge meter. U.S. Pat. No. 5,049,803 to Palanisamy discloses a method and apparatus for charging and testing batteries. U.S. Pat. No. 5,119,011 to Lambert discloses a battery state of charge indicator. U.S. Pat. No. 5,130,658 to Bohmer discloses an apparatus and method for indicating state of charge of a battery. U.S. Pat. No. 5,287,286 to Ninomiya discloses a low-battery state detecting system and method for detecting the residual capacity of a battery from the variation in battery voltage.

While these devices fulfill their respective, particular objective and requirements, the aforementioned patents do not describe a programmable battery charge indicator that allows a user to compare a voltage on a test battery to a predetermined reference voltage or a user-programmed reference voltage unique to the test battery to determine the exact percentage of charge on the test battery. This precise determination will allow the user to determine the exact charge state of the test battery and indicate to the user when to recharge the battery in order to maximize the test battery's usable life.

In this respect, the programmable battery charge indicator according to the present invention substantially departs from the conventional concepts and designs of the prior art, and in doing so provides an apparatus primarily developed for the purpose of allowing a user to monitor the condition and charge of a regular and deep cycle 12 volt lead-acid battery.

Therefore, it can be appreciated that there exists a continuing need for new and improved programmable battery charge indicator which can be used for allowing a user to monitor the condition and charge of a regular and deep cycle 12 volt lead-acid battery and thus, by recharging at the proper time, maximize the battery's useful life. In this regard, the present invention substantially fulfills this need.

SUMMARY OF THE INVENTION

In the view of the foregoing disadvantages inherent in the known types of battery charge indicators now present in the prior art, the present invention provides an improved programmable battery charge indicator. As such, the general purpose of the present invention, which will be described subsequently in greater detail, is to provide a new and improved programmable battery charge indicator and method which has all the advantages of the prior art and none of the disadvantages.

To attain this, the present invention essentially comprises, in combination, a hollow rigid box-shaped housing having a bottom wall, a top wall, a pair of opposed side walls, a back wall, and a front panel with a peripheral border therearound. A charge indicator circuit is disposed within the housing. The charge indicator circuit includes a pair of electrically-conductive sheathed terminal wires with one wire designated as a negative terminal wire and the other wire designated as a positive terminal wire. Each terminal wire has a base end and a tip end. Each tip end is extended through the housing and terminated with a spring-loaded battery clip or permanent battery terminal connector. Each battery clip or termination is coupleable to a separate pole of a test battery. The charge indicator circuit includes timer-controlled power delivery circuitry coupled to the base ends of the terminal wires. The timer-controlled power delivery circuitry has an activated mode for allowing transmission of electrical power from a test battery for a period of between about 10 to 15 seconds. The timer-controlled power delivery circuitry further has a deactivated mode for preventing transmission of electrical power. The charge indicator circuit includes a first light-emitting diode coupled to the timer-controlled power delivery circuitry for receiving electrical power from a test battery for operation. The first light-emitting diode is extended through the front panel of the housing. The first light-emitting diode is illuminated when the timer-controlled power delivery circuitry is placed in the activated mode. The charge indicator circuit includes a normally open single pole single throw push button switch coupled between the base end of the negative terminal wire and the timer-controlled power delivery circuitry. The push button switch has a momentarily closed orientation for generating a timer activation signal for placing the timer-controlled power delivery circuitry in an activated mode and further has an open orientation for preventing such generation. The charge indicator circuit includes reference voltage generating circuitry coupled to the timer-controlled power delivery circuitry for receiving electrical power from a test battery for operation. The reference voltage generating circuitry has a standard mode for generating a standard battery reference voltage for comparison with a voltage supplied from a test battery. The reference voltage circuitry further has a programmable mode for generating a user-selected battery reference voltage that is initially set based upon a voltage supplied from a user's fully-charged test battery acting as a calibration source. The reference voltage generating circuity includes display driver circuitry for generating a sequence of bar graph driver signals that are activated in sequence as a function of a voltage on a test battery. The charge indicator circuit includes comparator circuitry coupled to the reference voltage generating circuitry for receiving the reference voltage therefrom. The comparator circuitry is further coupled to the timer-controlled power delivery circuitry for receiving electrical power from a test battery for operation and a voltage from a test battery for testing. The comparator circuitry generates an overcharged designator signal representing an overcharged battery condition when a voltage on a test battery is greater than the reference voltage. The comparator circuitry generates an undercharged designator signal representing an undercharged battery condition when a voltage on a test battery is less than about 10% of the reference voltage. The charge indicator circuit includes a second light-emitting diode operatively coupled to the comparator circuitry and timer-controlled power delivery circuitry. The second light-emitting diode is extended through the front panel of the housing. The second light-emitting diode is illuminated for indicating an overcharged battery condition based on the receipt of an overcharged designator signal and further illuminated for indicating an undercharged battery condition based on the receipt of an undercharged designator signal. The charge indicator circuit includes a set of ten light-emitting diodes coupled to the timer-controlled power delivery circuitry and display driver circuitry. The set of diodes is further extended through the front panel of the housing in a linear bar graph-type configuration. A number of diodes from the set are selectively illuminated based upon receipt of the bar graph driver signals and with the number of diodes illuminated indicating a percentage of charge on a test battery ranging from about 10% up to 100%.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved programmable battery charge indicator which has all the advantages of the prior art battery charge indicators and none of the disadvantages.

It is another object of the present invention to provide a new and improved programmable battery charge indicator which may be easily and efficiently manufactured and marketed.

It is a further object of the present invention to provide a new and improved programmable battery charge indicator which is of durable and reliable construction.

An even further object of the present invention is to provide a new and improved programmable battery charge indicator which is susceptible of a low cost of manufacture with regard to both materials and labor, and which accordingly is then susceptible of low prices of sale to the consuming public, thereby making such a programmable battery charge indicator economically available to the buying public.

Still yet another object of the present invention is to provide a new and improved programmable battery charge indicator which provides in the apparatuses and methods of the prior art some of the advantages thereof, while simultaneously overcoming some of the disadvantages normally associated therewith.

Even still another object of the present invention is to provide a new and improved programmable battery charge indicator for allowing a user to monitor the condition and charge of a regular and deep cycle 12 volt lead-acid battery and determine at what state of discharge that the battery should be recharged to maximize battery life.

Lastly, it is an object of the present invention to provide a new and improved programmable battery charge indicator comprising a pair of electrically-conductive terminals each coupleable to a separate pole of a test battery; user-actuated timer-controlled power delivery means coupled with the terminals and having an activated mode for allowing transmission of electrical power from a test battery for a given period of time; reference voltage generating means coupled to and in dependent operative association with the power delivery means and having a standard mode for generating a standard battery reference voltage and further having a programmable mode for generating a user-selected battery reference voltage; comparator means coupled to and in dependent operative association with the reference voltage generating means and power delivery means for generating an overcharged designator signal representing an overcharged battery condition when a voltage on a test battery is greater than the reference voltage and for generating an undercharged designator signal representing an undercharged battery condition when a voltage on a test battery is less than the reference voltage; and display means operatively coupled to and in dependent operative association with the comparator means and power delivery means for indicating an overcharged battery condition, an undercharged battery condition, and a percentage of charge on a test battery.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

The same reference numerals refer to the same parts through the various Figures.

DESCRIPTION OF THE PREFERRED EMBODIMENT

Figure 1:
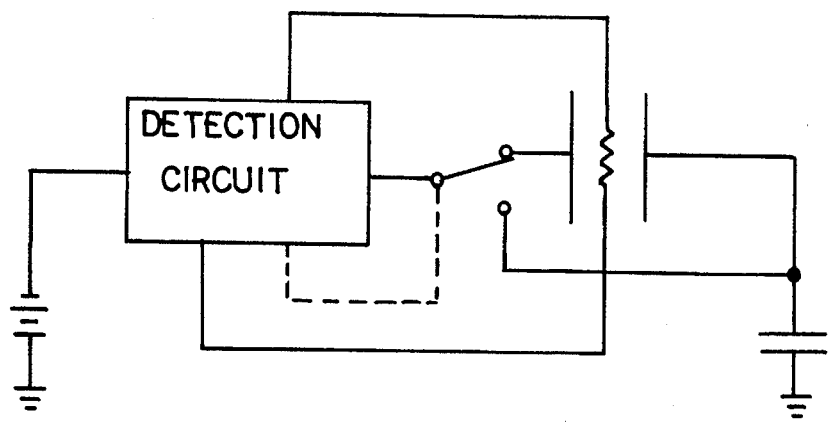
FIG. 1 is a prior art apparatus for indicating state of charge of a battery.
Figure 2:
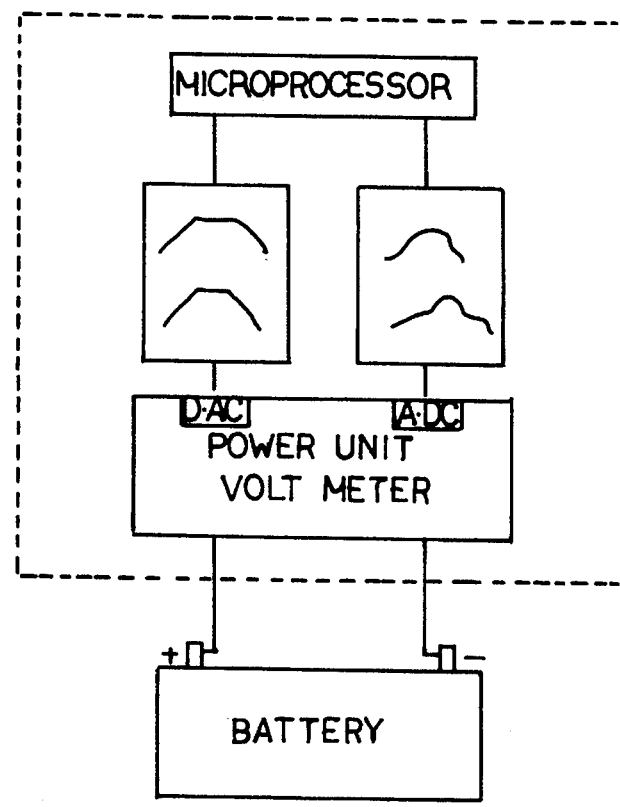
FIG. 2 is another prior art apparatus for charging and testing batteries.
Figure 3:
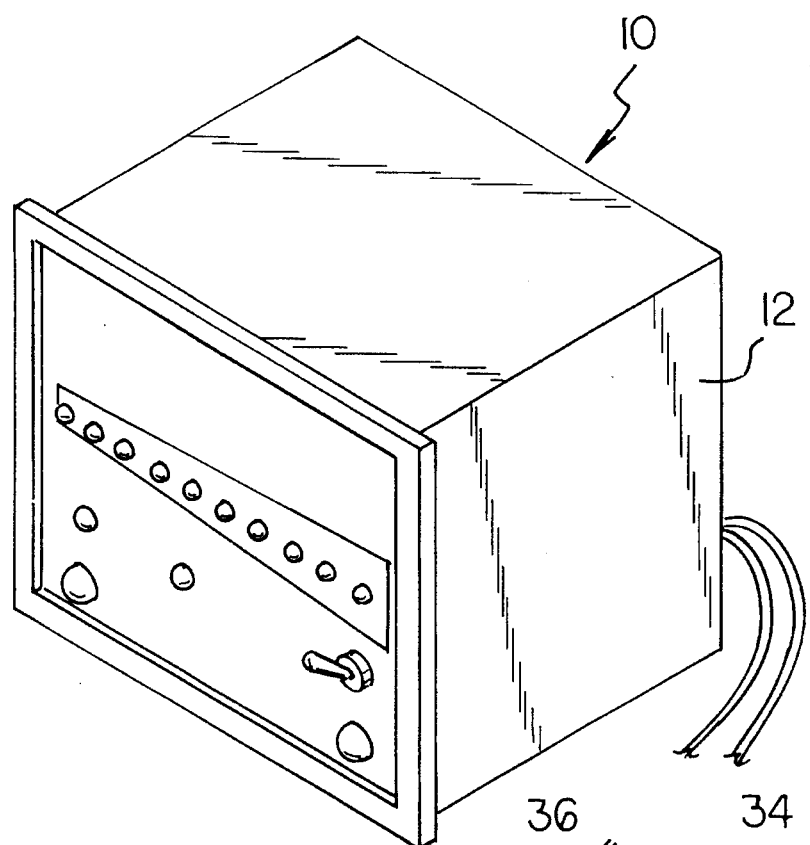
FIG. 3 is a perspective view of the preferred embodiment constructed in accordance with the principles of the present invention.
Figure 4:
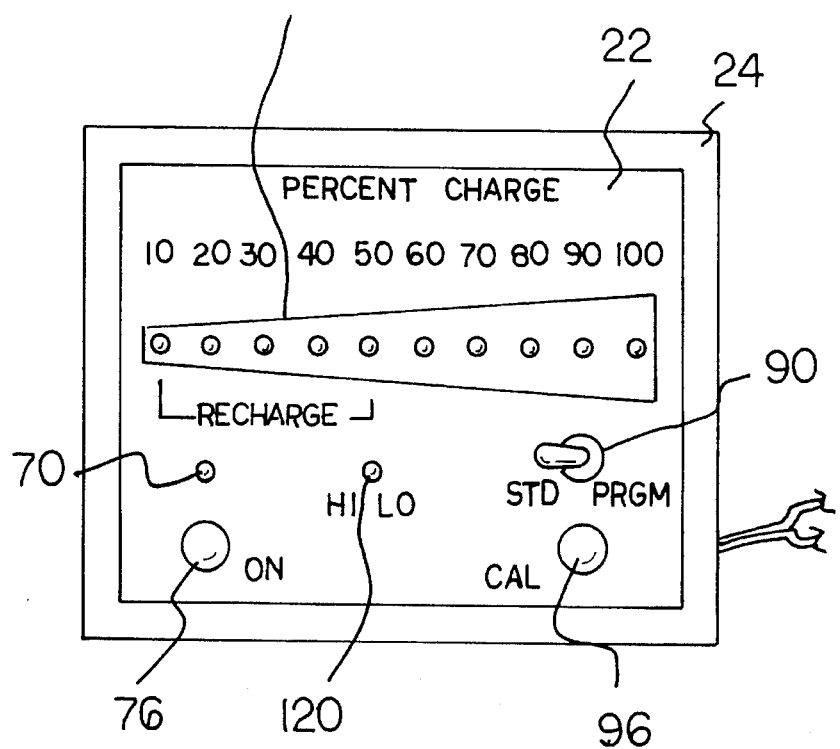
FIG. 4 is a side-elevational view of the front panel of the housing for controlling the present invention.
Figure 5:
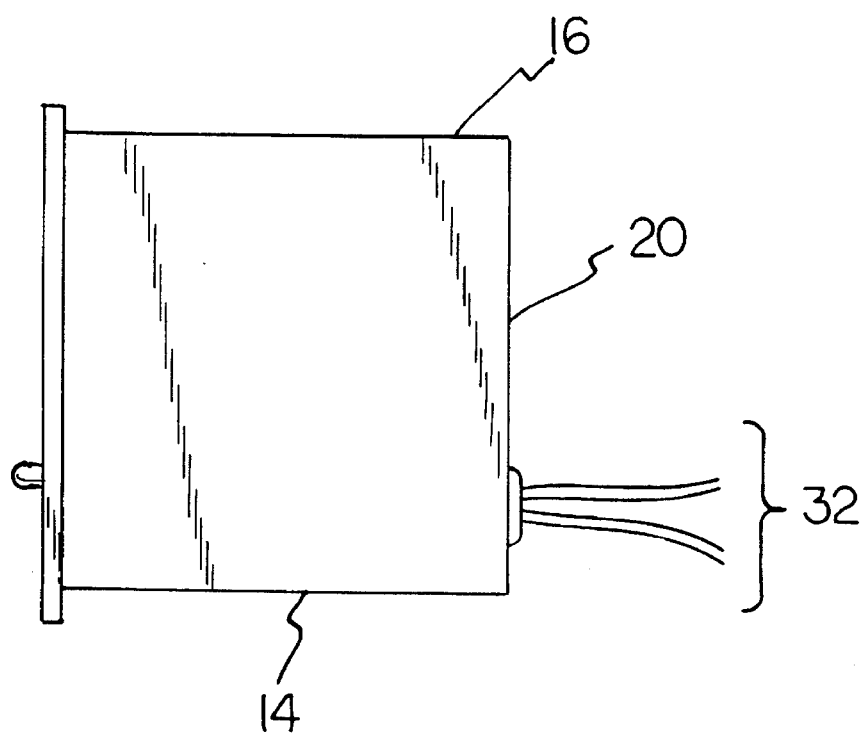
FIG. 5 is yet another side-elevational view of the housing of the present invention.
Figure 6:
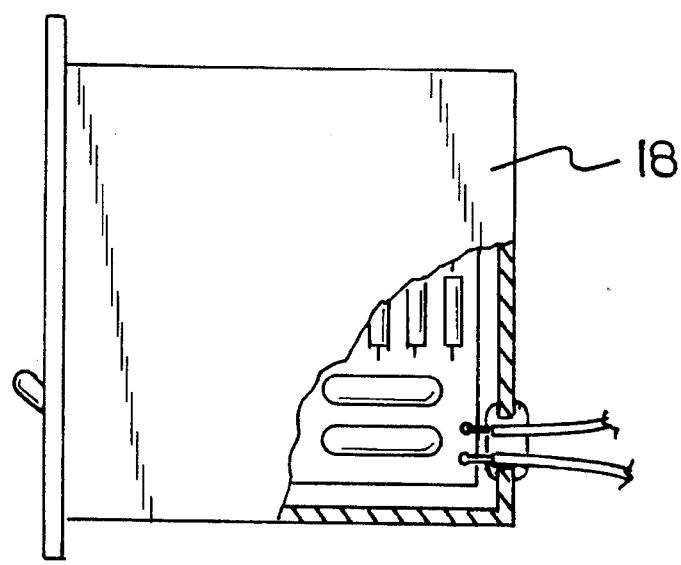
FIG. 6 is a side-elevational view of the present invention with a portion of a side wall of the housing removed for depicting the charge indicator circuitry contained therein.
Figure 7:
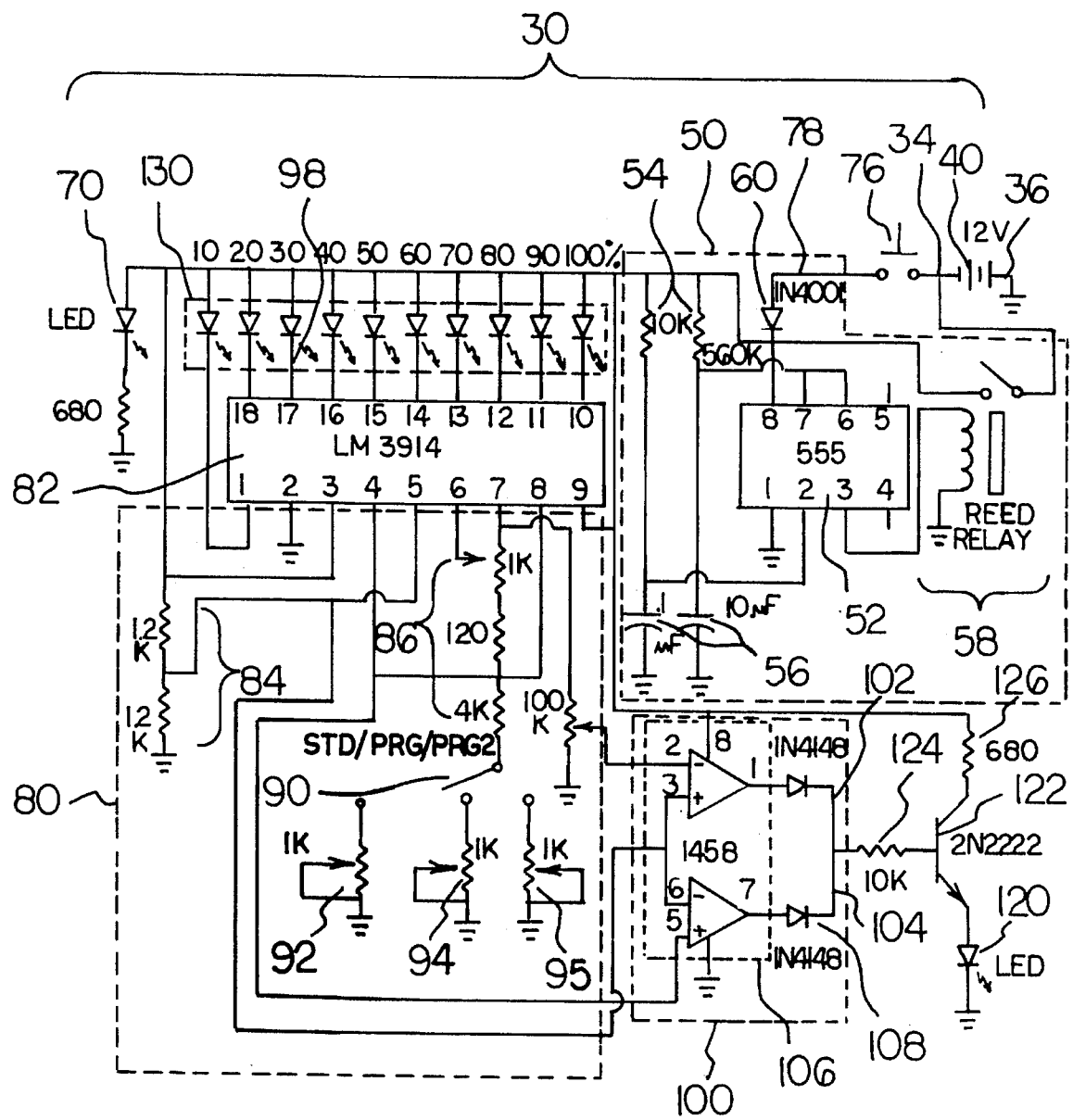
FIG. 7 is a schematic diagram of the charge indicator circuitry of the present invention.

With reference now to the drawings, and in particular, to FIGS. 3 through 6 thereof, the preferred embodiment of the new and improved programmable battery charge indicator embodying the principles and concepts of the present invention and generally designated by the reference number 10 will be described.

The preferred embodiment of the present invention comprises a plurality of components. In their broadest context, such components include a set of terminal wires, timer-controlled power delivery circuitry, reference voltage generating circuitry, comparator circuitry, lamps, and switches. Such components are individually configured and correlated with respect to each other to provide the intended function of allowing a user to monitor the condition and charge of a regular and deep cycle 12 volt lead-acid battery.

Specifically, the present invention includes a box-shaped housing 12. The housing is hollow in structure. It is formed of plastic, metal, or other similar rigid material. The housing has a bottom wall 14, a top wall 16, and a pair of opposed side walls 18. Furthermore, the housing has a back wall 20 and a front panel 22. The front panel has a peripheral border 24.

The present invention includes a charge indicator circuit 30 for testing the charge on a 12-volt battery. The charge indicator circuit is disposed within the housing. The charge indicator circuit includes a pair of electrically conductive and plastic sheathed terminal wires 32. One wire is designated as a negative terminal wire 34 and is black in color. The other wire is designated as a positive terminal wire 36 and is red in color. Each terminal wire has a base end disposed within the housing and a tip end extended therefrom. Each tip end of each terminal wire is terminated with a spring-loaded and electrically conductive metal battery clip or a permanent battery terminal connector 38. Each battery clip or termination is coupleable to a separate pole of a test battery 40. When the terminals are secured to a test battery in an operative mode, the negative terminal wire is coupled to the negative battery pole and the positive terminal wire is coupled to a positive battery pole.

Also included is timer-controlled power delivery circuitry 50. The timer-controlled power delivery circuitry is operatively coupled to the base ends of the terminal wires 32. The timer-controlled power delivery circuitry has an activated mode for allowing transmission of electrical power from a test battery 40 coupled with the terminal wires 32 for a period of between about 10 to 15 seconds. Furthermore, the timer-controlled power delivery circuitry has a deactivated mode for preventing such transmission of electrical power. The timer-controlled power delivery circuitry includes a commercially available 555 timer 52. The period of time which the 555 timer is activated is set through associated resistors 54 and capacitors 56. The output at pin 3 of the 555 timer is coupled to a Reed relay switch 58. The relay switch is activated when the 555 timer is activated. The relay switch 58 consists of a coil and magnetically attractive switch with a magnetic core operatively therebetween. When the timer is activated, the core of the relay switch is magnetized through the coil, thereby placing the magnetically attractive switch into a closed position. Once the time period has been expended, the coil is de-energized and the magnetically attractive switch returns to an open position. Also provided with the timer-controlled power delivery circuitry is a commercially available IN4001 diode 60 coupled to pin 8 of the 555 timer. Diode 60 protects the 555 timer from reverse activation voltages that may be applied thereto if the test battery is improperly connected to the terminal wires (i.e. positive test battery pole to negative terminal wire and negative test battery pole to positive terminal wire).

Also provided is an ON indicator lamp. The ON indicator lamp is formed of a first light-emitting diode 70. Diode 70 is operatively coupled to the timer-controlled power delivery circuitry 50 for receiving electrical power from a test battery 40 for illumination. Diode 70 is also extended through the front panel 22 of the housing and is illuminated when the timer-controlled power delivery circuitry is placed in the activated mode.

An ON button is included and formed of a normally open single pole single throw push button switch 76. Push button switch 76 is coupled between the base end of the positive terminal wire 34 and the timer-controlled power delivery circuitry 50. The push button switch has a momentarily closed orientation for generating a timer activation signal 78. The timer activation signal generated is used for placing the timer-controlled power delivery circuitry in the activated mode. Push button switch 76 also has an open orientation for preventing the generation of a timer activation signal.

Reference voltage generating circuitry 80 is provided and coupled to the timer-controlled power delivery circuitry 50. The reference voltage generating circuitry receives electrical power from a test battery 40 for operation. The reference voltage generating circuitry has a standard mode for generating a standard battery reference voltage for comparison with a voltage supplied from a test battery. It further has a programmable mode for generating a user-selected battery reference voltage. This user-selected voltage is initially set using a voltage supplied from a user's fully-charged test battery as a calibration source. To generate the reference voltages, a commercially available LM3914 bar graph display driver integrated circuit 82 is provided. The display driver is operatively fed by a voltage divider network 84. Divider network 84 reduces the input voltage from the test battery to a value compatible for use in generating a reference voltage. The reference voltage generating circuitry also includes a reference voltage resistive adjustment network 86. This voltage adjustment network includes a variable resistor that is preset to a given value for use in generating a standard battery reference voltage. Also provided is a SELECT switch 90. The SELECT switch is coupled to the voltage adjustment network 86 and extended through the front panel 22 of the housing. Two or more potentiometers 92 and 94 and 95 are operable in conjunction with the voltage adjustment network and selectively engaged by the SELECT switch 90. Potentiometer 92 is used for allowing a standard and predetermined reference voltage of 12.63 volts to be generated. Potentiometer 92 is preset and not accessible by a user. Potentiometer 94 and 95 allow a user to set a selected battery reference voltage when a fully charged test battery acting as a calibration source is coupled to the terminal wires 32. Potentiometer 94 and 95 are accessible by a user through the front panel 22 by removal of a calibration plug 96 and are adjusted through the turning of an operatively associated screw. The present invention could also be programmed for independently testing a plurality of batteries by adding a potentiometer as previously described for each battery to be tested.

Furthermore, the reference voltage generating circuity also includes display driver circuitry. In the preferred embodiment, the display driver circuitry is included as part of the commercially available LM3914 bar graph display driver integrated circuit 82. The LM3914 allows the generation a sequence of bar graph driver signals at pins 10–18 that is activated in reverse sequence as a function of a voltage on a test battery.

To compare a voltage of a test battery to a reference voltage from the reference voltage generating circuitry 80, comparator circuitry 100 is also included. The comparator circuitry is coupled to the reference voltage generating circuitry 80 for receiving a reference voltage therefrom. The comparator circuitry is also coupled to the timer-controlled power delivery circuitry 50 for receiving electrical power from a test battery 40 coupled to the terminal wires 32 for operation and a corresponding voltage from a test battery for testing. The comparator circuitry generates an overcharged designator signal 102 representing an overcharged battery condition when a voltage or charge on a test battery is greater than the reference voltage. The comparator circuitry also generates an undercharged designator signal 104 representing an undercharged battery condition when a voltage or charge on a test battery is less than about 10% of the reference voltage. The comparator circuitry includes a commercially available 1458 dual operational amplifier integrated circuit 106. Each operational amplifier of the 1458 is configured to act as a comparator. Coupled to the output of each operational amplifier is a commercially available IN4148 diode 108. Diode 108 ensures that a reverse current does not flow through its corresponding input operational amplifier when the neighboring operational amplifier is activated.

To provide a user an indication of an overcharged or undercharged battery condition, a HIGH/LOW indicator lamp is extended from the front panel 22 of the housing. The HIGH/LOW indicator lamp is formed of a second light-emitting diode 120. Diode 120 is operatively coupled to the comparator circuitry 100 and timer-controlled power delivery circuitry 50. Diode 120 is illuminated for indicating an overcharged battery condition based upon the receipt of an overcharged designator signal 102. Diode 120 is further illuminated for indicating an undercharged battery condition based on the receipt of an undercharged designator signal 104. Diode 120 is activated through a commercially available 2N2222 NPN transistor 122. The base of transistor 122 is connected to a biasing resistor 124. Current supplied to diode 120 is limited to an operable amount by a current limiting resistor 126 coupled to the collector of transistor 122.

Charge percentage indicator lamps for indicating a percentage of charge on a test battery are included and formed of a set of ten light-emitting diodes 130. The set of diodes 130 are coupled to the timer-controlled power delivery circuitry 50 and display driver circuitry of the LM3914. The set of diodes is further extended through the front panel of the housing in a linear configuration. A number of diodes from the set are selectively illuminated in sequence to represent a bar graph. The number of diodes of the set illuminated indicate a percentage of charge on the battery ranging from about 10% up to about 100% as shown on the front panel 22. If the battery voltage is greater than the referenced voltage, an overcharged condition exists. In this instance, all percent indicator lamps are illuminated and the HIGH/LOW indicator lamp is also illuminated. If the battery voltage is less than 10% of the reference voltage, an under charged condition exists. The percent indicator lamps in this instance are not illuminated; however, the HIGH/LOW indicator lamp is illuminated.

The present invention is a battery charge indicator that can be adjusted to match the characteristics of a specific test battery so that the output of the test battery can be evaluated very precisely in percentage terms of the optimum value. The present invention is small so it can be used almost anywhere. It has a rigid housing which is only about 3 inches wide, 2½ inches high, and about 2½ inches deep. The present invention can also be fabricated with a housing that is much smaller and compact if to fit a wide variety of applications. The electronic circuitry within the housing is composed of circuitry for measuring voltage or charge on a battery. The front panel lights are selectively illuminated to show the condition of the battery in terms of the percentage of the maximum operating output voltage, ranging from 10% through 100% in increments of 10%. The terminal wires from the back of the housing are clipped or permanently attached onto poles of a battery to be tested, and a switch 90 is turned to the program position (PRG) shown on the display. When the ON button 76 is pressed momentarily and released, a lamp 70 will glow, as well as some of the percentage indicator lamps 130 to show the condition of the battery. A new, fully charged test battery should be checked with this unit and a calibration screw operatively associated with potentiometer 94 adjusted to indicate the 100% charge level for that test battery. Since as little as a 0.20 drop in voltage results in a loss of about 25% of output power, accurate readings are important to allow the test battery to be recharged before the output drops below 50% to obtain maximum life from it.

The present invention helps monitor the condition and charge of a regular and deep cycle 12 volt lead-acid battery. By monitoring the charge in the battery, a user can extend the battery life through proper charging schedules. The present invention can be used with any 12 volt system that uses lead-acid batteries. Applications include auxiliary power for marine and recreation vehicles, portable electronic equipment (not for use with NiCad batteries), and especially useful on small boats with 12-volt, electric trolling motors.

Typical 12-volt lead-acid batteries exhibit a slight reduction in output voltage as they discharge. A 0.20 voltage drop in a no-load output voltage of a battery equates to about 25% loss of full charge. Most batteries have a full charge voltage between 12.60 volts and 12.80 volts. The industry standard for a fully charged battery is 12.63 volts.

There are many prior art analog charge indicator meters, and they rely on only the 12.63 volt standard for the fully charged mark on their meter face. However, each battery is manufactured slightly different and the 12.63 volt standard for a full charge will not be correct for each battery. If a battery had a full charge voltage of 12.80 volts, the standard 12.63 volt charge indicator would have an error of 21%. For optimum performance and battery life, lead-acid batteries should be recharged before the charge goes below 50% of full charge. The present invention offers a user a choice of charging schemes. The present invention will operate using the standard 12.63 voltage full charge reference or it can be programmed for a proper full charge for a user's battery.

To operate the present invention, follow these steps:

1. Connect the positive terminal wire to the positive pole of a 12-volt test battery. Connect the negative terminal wire to the negative pole of the 12-volt test battery. Use AWG #14 wire or larger and connect directly to the battery to avoid a voltage drop.
2. Flip the SELECT switch to STD.
3. Momentarily press and release the ON button. The ON indicator lamp will glow and if the test battery is in relatively good condition, the percent charge against a 12.63 voltage standard will be indicated by the charge percentage indicator lamps. The charge percentage indicator lamps will be automatically shut off after about 10 seconds. For best accuracy, there should be no other load on the test battery other than the present invention.

To insure maximum accuracy of the present invention, it can be programmed to the full charge voltage of a test battery as follows:

1. Check the electrolyte level in the battery if possible. If it is low, fill it to the proper level with distilled water. Charge the battery using a 12-volt battery charger for 24 hours. Do not rely on an alternator to fully charge the battery.
2. Remove the battery from the charger after 24 hours and allow it to "rest" for another 24 hours. If possible, do not let the battery sit on bare cement as this can drain the battery. When removed from the charger, the battery voltage will gradually drop from 13.3 charging voltage to its full charge between 12.60 and 12.80 volts.
3. Connect the present invention to the test battery as described in steps 1 through 3 above.
4. Flip the SELECT switch to STD. Momentarily press and release the ON button. If none of the charge percentage indicator lamps are lit and the HIGH/LOW indicator is lit, the user probably has a weak or bad cell in the battery, and the battery or cell should be replaced. If all the charge percentage indicator lamps are lit and the HIGH/LOW indicator is lit, a user's battery has a full charge voltage of more than 12.80 volts. This is not very common and is usually the result of an inadequate "rest" period after charging. The present invention can now be programmed, however, but accuracy may be reduced.
5. Flip the SELECT switch to PRGM. If the charge indicator shuts off at any time during programming, simply press and release the ON button. Remove the calibration plug to allow access to an adjustment screw inside the case. With a small screwdriver, turn the adjusting screw to the right clockwise until the 80, 90, and 100% indicator lights go out. Slowly turn the adjustment screw to the left (counterclockwise) and stop after the 100% indicator glows. If a user goes too far in adjustment, the HIGH/LOW indicator lamp will light. Now, back the screw off to the left and repeat the adjustment until all charge percentage indicators are lit and the HIGH/LOW indicator lamp is not lit.

The present invention is now programmed for a user's battery and will indicate percent charge remaining in the battery. The battery should be recharged when it reaches 50% of full charge. It is not necessary to let the battery "rest" after a charge unless a user is programming the charge indicator. If the HIGH/LOW indicator lights after a full charge without a "rest," it can be ignored as explained above.

The full charge voltage on a user's battery will vary as it ages. It is recommended that the present invention be reprogrammed for a user's battery at least once each year or when a fully charged battery does not indicate a 100% charge.

The present invention is water-resistant. However, it should not be mounted where it will get wet from heavy water, spray, or rain. Also, mounting the present invention where it will receive direct sunlight will make the indicator lamps difficult to read.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and the manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modification and changes will readily occur to those skilled in the art, it is not desired to limit the invention to the exact construction and operation shown and described, and accordingly, all suitable modification and equivalents may be resorted to, falling within the scope of the invention.

What is claimed as being new and desired to be protected by letters patent of the United States is as follows:

1. A programmable battery charge indicator for allowing a user to monitor the condition and charge of a regular and deep cycle 12 volt lead-acid battery comprising, in combination:

a hollow rigid box-shaped housing having a bottom wall, a top wall, a pair of opposed side walls, a back wall, and a front panel with a peripheral border therearound;

a charge indicator circuit disposed within the housing and further comprising:

a pair of electrically-conductive sheathed terminal wires with one wire designated as a negative terminal wire and the other wire designated as a positive terminal wire, each terminal wire having a base end and a tip end with each tip end extended through the housing and terminated with a spring-loaded battery clip or permanently attached battery terminal connector, each battery clip coupleable to a separate pole of a test battery;

timer-controlled power delivery circuitry coupled to the base ends of the terminal wires and having an activated mode for allowing transmission of electrical power from a test battery for a period of between about 10 to 15 seconds and further having a de-activated mode for preventing such transmission;

a first light-emitting diode coupled to the timer-controlled power delivery circuitry for receiving electrical power from a test battery for operation and extended through the front panel of the housing, the first light-emitting diode illuminated when the timer-controlled power delivery circuitry is placed in the activated mode;

a normally open single pole single throw push button switch coupled between the base end of the negative terminal wire and the timer-controlled power delivery circuitry, the push button switch having a momentarily closed orientation for generating a timer activation signal for placing the timer-controlled power delivery circuitry in an activated mode and further having an open orientation for preventing such generation;

reference voltage generating circuitry coupled to the timer-controlled power delivery circuitry for receiving electrical power from a test battery for operation and having a standard mode for generating a standard battery reference voltage for comparison with a voltage supplied from a test battery and further having a programmable mode for generating a user-selected battery reference voltage initially set based upon a voltage supplied from a user's fully-charged test battery acting as a calibration source, the reference voltage generating circuity including display driver circuitry for generating a sequence of bar graph driver signals that are activated in sequence as a function of a voltage on a test battery;

comparator circuitry coupled to the reference voltage generating circuitry for receiving a reference voltage therefrom and further coupled to the timer-controlled power delivery circuitry for receiving electrical power from a test battery for operation and a voltage from a test battery for testing, the comparator circuitry generating an overcharged designator signal representing an overcharged battery condition when a voltage on a test battery is greater than the reference voltage, the comparator circuitry generating an undercharged designator signal representing an undercharged battery condition when a voltage on a test battery is less than about 10% of the reference voltage;

a second light-emitting diode operatively coupled to the comparator circuitry and timer-controlled power delivery circuitry and extended through the front panel of the housing, the second light-emitting diode illuminated for indicating an overcharged battery condition based on the receipt of an overcharged designator signal and further illuminated for indicating an undercharged battery condition based on the receipt of an undercharged designator signal; and a set of ten light-emitting diodes coupled to the timer-controlled power delivery circuitry and display driver circuitry and further extended through the front panel of the housing in a linear bar graph-type configuration, a number of diodes from the set selectively illuminated in sequence based upon receipt of the bar graph driver signals and with the number of diodes illuminated indicating a percentage of charge on a test battery ranging from about 10% up to 100%.

2. A programmable battery charge indicator comprising:

a pair of electrically-conductive terminals each coupleable to a separate pole of a test battery;

user-actuated timer-controlled power delivery means coupled with the terminals and having an activated mode for allowing transmission of electrical power from a test battery for a given period of time;

reference voltage generating means coupled to and in dependent operative association with the timer-controlled power delivery means and having a standard mode for generating a standard battery reference voltage and further having a programmable mode for generating a user-selected battery reference voltage;

comparator means coupled to and in dependent operative association with the reference voltage generating means and timer-controlled power delivery means for generating an overcharged designator signal representing an overcharged battery condition when a voltage on a test battery is greater than the reference voltage and for generating an undercharged designator signal representing an undercharged battery condition when a voltage on a test battery is less than the reference voltage; and display means operatively coupled to and in dependent operative association with the comparator means and timer-controlled power delivery means for indicating an overcharged battery condition, an undercharged battery condition, and a percentage of charge on a test battery.

3. The programmable battery charge indicator as set forth in claim 2 wherein the user-actuated timer-controlled power delivery means, reference voltage generating means, comparator means, and display means are encased and in a rigid container.

4. The programmable battery charge indicator as set forth in claim 2 wherein the timer-controlled power delivery means is transmits electrical power for about 10 to 15 seconds when in the activated mode.

5. The programmable battery charge indicator as set forth in claim 2 further including a light source coupled to the timer-controlled power delivery means with the light source illuminated when the timer-controlled power delivery means is placed in the activated mode.

6. The programmable battery charge indicator as set forth in claim 2 wherein an overcharged designator signal is generated by the comparator means when a voltage on a test battery is less than about 10% of the reference voltage.

* * * * *